United States Patent
Takamatsu et al.

(10) Patent No.: US 6,473,563 B2
(45) Date of Patent: Oct. 29, 2002

(54) VAPORIZER AND APPARATUS FOR VAPORIZING AND SUPPLYING

(75) Inventors: Yukichi Takamatsu, Hiratsuka (JP); Takeo Yoneyama, Hiratsuka (JP); Koji Kiriyama, Hiratsuka (JP); Akira Asano, Hiratsuka (JP); Kazuaki Tonari, Hiratsuka (JP); Mitsuhiro Iwata, Hiratsuka (JP)

(73) Assignee: Japan Pionics Co., Ltd., Tokyo (JP)

( * ) Notice: Subject to any disclaimer, the term of this patent is extended or adjusted under 35 U.S.C. 154(b) by 0 days.

(21) Appl. No.: 09/986,901

(22) Filed: Nov. 13, 2001

(65) Prior Publication Data

US 2002/0067917 A1 Jun. 6, 2002

(30) Foreign Application Priority Data

Dec. 1, 2000 (JP) .......................... 2000-366607
Apr. 27, 2001 (JP) .......................... 2001-130780

(51) Int. Cl.[7] .............................. C23C 14/00; B05D 5/12
(52) U.S. Cl. ........................................ 392/388; 427/124
(58) Field of Search ................................ 392/386, 388, 392/394, 398, 400, 401, 405; 118/715, 724; 427/124, 255.1, 255.2

(56) References Cited

U.S. PATENT DOCUMENTS 5,835,680 A * 11/1998 Glucksman et al. ........ 338/315
5,837,316 A * 11/1998 Fuchita ........................ 118/726
6,094,940 A * 8/2000 Fujiwara et al. ............. 261/128
6,110,283 A * 8/2000 Yamamuka et al. ......... 118/715
6,195,504 B1 * 2/2001 Horie et al. ................. 392/394

* cited by examiner

Primary Examiner—Sang Paik
(74) Attorney, Agent, or Firm—Oblon, Spivak, McClelland, Maier & Neustadt, P.C.

(57) ABSTRACT

There are disclosed a vaporizer wherein at least a portion of a CVD material feed portion in contact with a CVD material is constituted of a corrosion resistant synthetic resin; and an apparatus for vaporizing and supplying which comprises a cooler and the vaporizer wherein the inside of the CVD material feed portion of the vaporizer and the surface on the side of the vaporization chamber of the CVD material feed portion are constituted of a corrosion resistant synthetic resin; the feed portion in contact with the outside of the vaporizer is constituted of a metal; and the CVD material feed portion which is constituted of a metal and which undergoes heat transfer from the heating means upon heating the vaporization chamber can be cooled with a cooler. The vaporizer and apparatus, when used for supplying a gaseous CVD-material to CVD equipment for producing semiconductors, enables the CVD material to be efficiently vaporized and supplied at desirable concentration and flow rate without causing deposit or adhesion of the CVD material at a CVD material feed port even if a solid CVD-material is used.

16 Claims, 7 Drawing Sheets

VAPORIZER AND APPARATUS FOR VAPORIZING AND SUPPLYING

BACKGROUND OF THE INVENTION

1. Field of the Invention

The present invention relates to a vaporizer and an apparatus for vaporizing and supplying that are employed for supplying a chemical vapor deposition (CVD) apparatus used in the manufacture of a semiconductor and the like with a gaseous CVD-material.

More particularly, it pertains to a vaporizer and an apparatus for vaporizing and supplying that are employed for supplying a liquid CVD-material or a solution of a liquid CVD-material or a solid CVD-material in a solvent each at desirable concentration and flow rate in high efficiency without causing deterioration in the quality of the CVD materials.

2. Description of the Related Arts

With regard to an insulated thin film for a semiconductor device, there are available $SiO_2$ as a gate insulated film, $Si_3N_4$ as a capacitor insulated film and PSG (phosphorus/silicon/glass) and BPSG (boron/phosphorus/silicon/glass) as an gate interlaminar insulated film.

Gaseous CVD-materials such as $SiH_4$, $NH_3$, $PH_3$ and $B_2H_6$ have hitherto been used as a material for manufacturing the film material by means of a CVD apparatus.

With the progress of three dimensional devices and multi-layered wiring, a demand for flatness of the insulated films steadily increases, and thus use is made of a liquid CVD-material which is less prone to generate such defect as a void, and is capable of forming thin films of high quality. For instance, there are used tetraethoxysilicon $\{Si(OC_2H_5)_4\}$ as a starting material for $SiO_2$ film, trimethoxy boron $\{B(OCH_3)_3\}$, trimethoxyphosphorus $\{P(OCH_3)_3\}$ and the like as a CVD material for BPSG film.

In addition thereto, there has been developed a new type of thin film such as $Ta_2O_5$ film having a dielectric constant several times as high as that of $SiO_2$ film, and use is made of pentaethoxytantalum$\{Ta(OC_2H_5)_5\}$ in liquid form as a CVD material for $Ta_2O_5$ film.

Moreover, there have been used in recent years, lead titanate zirconate (PZT) film and barium strontium titanate (BST) film each having a high dielectric constant and also a high step coverage.

In regard to the CVD material for the above-mentioned thin films, there are used $Pb(DPM)_2$ (solid material) as a Pb source; $Zr\{OC(CH_3)_3\}_4$ (liquid material) as a Zr source; $Ti\{OCH(CH_3)_2\}_4$ (liquid material) as a Ti source; $Ba(DPM)_2$ (solid material) as a Ba source; and $Sr(DPM)_2$ (solid material) as a Sr source.

A liquid material, when being used as a CVD material, is made into a gaseous form with a vaporizer or the like, and thereafter is fed to a CVD apparatus. However, it is difficult to vaporize a liquid material at a desirable concentration and flow rate in high efficiency without deteriorating the quality thereof, since the liquid material has usually a low vapor pressure, a high viscosity and a vaporizing temperature close to a decomposing temperature. A solid material, although being capable of assuring highly pure material by being kept at a high temperature to sublime itself, makes it extremely difficult to assure sufficient supply amount in an industrial scale. Thus, in general it is dissolved in a solvent such as tetrahydofuran to make it into a liquid material so as to vaporize. However, since a solid material has a vaporizing temperature greatly different from that of a solvent, a solvent alone is more apt to vaporize by heating, thereby making it more difficult to vaporize a liquid material.

Such being the case, highly advanced technique is required for manufacturing an insulated thin film by using a material in liquid or solid form. Conversely, an insulated thin film having high quality and high purity is expectable by the use of a liquid material or solid material. Accordingly, a variety of vaporizers and apparatuses for vaporizing and supplying have been developed for the purpose of efficiently vaporizing the aforesaid material without deteriorating the quality thereof.

For instance, as a vaporizer for the purpose of vaporizing a liquid material, a vaporizer is cited which is in the form of a sphere, ellipsoid, barrel, cylinder assuming roundness at an end, cone, truncated cone or hemisphere, in the form similar to any of the foregoing or in a combined form thereof, and which is set such that a carrier gas forms a swirled flow in a vaporization vessel {refer to Japanese Patent Application Laid-Open No. 342328/1999 (Heisei-11)}.

By swirling a heated carrier gas along the internal wall surface of the vaporization vessel in the aforesaid vaporizer, a material which has been atomized with an atomizer at a CVD material feed port is entangled in the above-mentioned carrier gas and is heated in contact therewith, thus preventing to the utmost, direct heating through the internal wall surface thereof from deteriorating the quality of the material and depositing on the surface. Accordingly, the vaporizer is excellent in that it is expectable to enhance vaporization efficiency.

Nevertheless, in the case of using a CVD material in which a solid CVD-material is dissolved in an organic solvent, even the use of the vaporizer brings about such fears that the solvent alone is more prone to vaporize in the CVD material feed port, the solid CVD material is deposited during a long time of application and is stuck to the passageway of the material, and thereby exerts an evil influence on the quality of the insulated thin film and the purity thereof.

It is desirable to enhance the utilization efficiency of a CVD material which is usually expensive by supplying the material in high concentration in the case of chemical vapor deposition. However, a decrease in a feed amount of a carrier gas to be supplied accompanying the CVD material brings about such disadvantage that a solvent alone is vaporized, thus causing a solid CVD-material to be more prone to be deposited.

SUMMARY OF THE INVENTION

In such circumstances, an object of the present invention is to provide, even in the case of employing a solid CVD-material, a vaporizer and an apparatus for vaporizing and supplying which comprises the aforesaid vaporizer, which is capable of efficiently vaporizing a CVD material at a desirable concentration and flow rate without causing deposit or adhesion of the solid material in the CVD material feed port.

Other objects of the present invention will become obvious from the text of this specification hereinafter disclosed.

Under such circumstances, intensive extensive research and development were accumulated by the present inventors in order to solve the above-described problems involved in the prior arts. As a result, the following has been found. Specifically, even in the case of using a CVD material in which a solid CVD-material is dissolved in an organic solvent, it is made possible to prevent rapid heating of a solid CVD-material which is one of the causes for vaporization of an organic solvent alone and also to make deposit of the solid CVD-material less liable to adhere even if such deposit is generated, by constructing constitution material for the portion in contact with a CVD material in the CVD material feed portion by means of a corrosion resistant synthetic resin which has not only heat resistance but also heat insulating properties and characteristics of less liability to adhesion of the CVD material, and which is exemplified by fluororesin and polyimide resin in particular, and further by cooling a CVD material feed portion upon heating a vaporization chamber. Thus, the present invention has been accomplished by the foregoing findings and information.

That is to say, the present invention is related to a vaporizer which comprises a vaporization chamber for a CVD material, a CVD material feed portion for supplying the vaporization chamber with the CVD material, a vaporized gas exhaust port and a heating means for heating the vaporization chamber, characterized in that at least a portion of the CVD material feed portion in contact with the CVD material is constituted of a corrosion resistant synthetic resin.

In addition, the present invention is concerned with a vaporizer which comprises a vaporization chamber for a CVD material, a CVD material feed portion for supplying the vaporization chamber with the CVD material, a vaporized gas exhaust port and a heating means for heating the vaporization chamber, characterized in that the inside of the CVD material feed portion and the surface on the side of the vaporization chamber of the CVD material feed portion are constituted of a corrosion resistant synthetic resin, and the feed portion in contact with the outside of the vaporizer is constituted of a metal.

At the same time, the present invention pertains to an apparatus for vaporizing and supplying which comprises a cooler and a vaporizer which harbors a vaporization chamber for a CVD material, a CVD material feed portion for supplying the vaporization chamber with the CVD material, a vaporized gas exhaust port and a heating means for heating the vaporization chamber, characterized in that the inside of the CVD material feed portion of the vaporizer and the surface on the side of the vaporization chamber of the CVD material feed portion are constituted of a corrosion resistant synthetic resin; the feed portion in contact with the outside of the vaporizer is constituted of a metal; and at least a part of the metal-constituted portion of the CVD material feed portion which undergoes heat transfer from the heating means at the time of heating the vaporization chamber, is of such constitution that enables said part to be cooled with said cooler.

DESCRIPTION OF THE PREFERRED EMBODIMENTS

The present invention is applied to a vaporizer which vaporizes a liquid CVD-material or a liquid CVD-material made up of a solution of a liquid CVD-material or a solid CVD-material in a solvent, and which supplies CVD equipment or the like with a vaporized gas. In the case where a solid CVD-material is used, the vaporizer exhibits its effect particularly in view of the capability of preventing the deposit and adhesion of a solid CVD material at a CVD material feed portion of the vaporizer.

The vaporizer according to the present invention is a vaporizer in which at least a portion of the CVD material feed portion in contact with the CVD material is constituted of a corrosion resistant synthetic resin which has not only heat resistance but also heat insulating property and characteristics of less liability to adhesion of the CVD material, and which is exemplified by fluororesin and polyimide resin, preferably the inside of the CVD material feed portion and the surface on the side of the vaporization chamber of the CVD material feed portion are each constituted of a corrosion resistant synthetic resin having the above-mentioned characteristics, and the feed portion in contact with the outside of the vaporizer is constituted of a metal having high airtightness.

Moreover, the apparatus for vaporizing and supplying according to the present invention is an apparatus which comprises at least the aforesaid vaporizer and a cooler, and in which the foregoing metal-constituted portion which undergoes heat transfer from the heating means at the time of heating the vaporization chamber can be cooled with a cooler.

The CVD material to which are applicable the vaporizer and the apparatus for vaporizing and supplying is not specifically limited, provided that the CVD material can be kept in liquid state whether it is in liquid state at ordinary temperature or a solution of a solid dissolved in a solvent. The CVD material is properly and optionally selected for use according to the purpose of use. Examples thereof include an alkoxide in liquid state at ordinary temperature such as tetraisopropoxytitanium ($Ti(OCH(CH_3)_2)_4$) tetra-n-propoxytitanium ($Ti(OC_3H_7)_4$), tetra-tert-butoxyzirconium ($Zr(OC(CH_3)_3)_4$), tetra-n-butoxyzirconium ($Zr(OC_4H_9)_4$), tetramethoxyvanadium ($V(OCH_3)_4$), trimethoxyvanadyl oxide ($VO(OCH_3)_3$), pentaethoxyniobium ($Nb(OC_2H_5)_5$), pentaethoxytantalum ($Ta(OC_2H_5)_5$), trimethoxyboron ($B(OCH_3)_3$),triisopropoxyaluminum ($Al(OCH(CH_3)_2)_3$), tetraethoxysilicon ($Si(OC_2H_5)_4$), tetraethoxygermanium ($Ge(OC_2H_5)_4$), tetraethoxytin ($Sn(OCH_3)_4$), trimethoxyphosphorus ($P(OCH_3)_3$), trimethoxyphosphineoxide ($PO(OCH_3)_3$), triethoxyarsenic ($As(OC_2H_5)_3$) and triethoxyantimony ($Sb(OC_2H_5)_3$).

Examples of the CVD material in liquid state at ordinary temperature other than the foregoing include trimethylaluminum ($Al(CH_3)_3$), dimethylaluminum hydride ($AL(CH_3)_2H$), triisobutylaluminum ($Al(iso.C_4H_9)_3$), hexafluoroacetylacetonecopper vinyltrimethylsilane (($CF_3CO$)$_2CHCu.CH_2$ $CHSi(CH_3)_3$), hexafluoroacetylacetonecopper allyltrimethylsilane (($CF_3CO$)$_2CHCu.CH_2CHCH_2Si(CH_3)_3$), bis(isopropylcyclopentadienyl)tungsten dihydride ((iso.$C_3H_7C_5H_5$)$_2WH_2$), tetradimethylaminozirconium(Zr $(N(CH_3)_2)_4$), pentadimethylaminotantulum (Ta$(N(CH_3)_2)_5$), pentadiethylaminotantulum (Ta$(N(C_2H_5)_2)_5$), tetradimethylaminotitanium (Ti$(N(CH_3)_2)_4$) and tetradiethylaminotitanium (Ti$(N(C_2H_5)_2)_4$).

Further examples of the CVD material in solid state at ordinary temperature other than the foregoing include hexacarbonylmolybdenum (Mo$(CO)_6$), dimethylpenthoxygold (Au$(CH_3)_2(OC_5H_7)$), bis(2,2,6,6-tetramethyl3,5-heptanedionite)barium (Ba$((C(CH_3)_3)_2C_3HO_2)_2$), bis(2,2,6,6-tetramethyl-3,5-heptanedionite)strontium (Sr$((C(CH_3)_3)_2C_3HO_2)_2$), tetra(2,2,6,6-tetramethyl-3,5-heptanedionite) titanium (Ti$((C(CH_3)_3)_2C_3HO_2)_4$), tetra(2,2,6,6-tetramethyl-3,5-heptanedionite)zirconium (Zr$((C(CH_3)_3)_2C_3HO_2)_4$), bis(2,2,6,6-tetramethyl-3,5-heptanedionite)lead (Pb$((C(CH_3)_3)_2C_3HO_2)_2$), (ditertiallybuthoxybis)(2,2,6,6-tetramethyl-3,5-heptanedionite)titanium,(diisopropoxy)(2,2,6,6-tetramethyl -3,5-heptanedionite)titanium, tetrakis (isobutyllylpivaloylmethanato)zirconium and (isopropoxy) tris(2,2,6,6-tetramethyl-3,5-heptanedionite) zirconium. The above-exemplified materials need to be dissolved in an organic solvent in a concentration of usually 0.1 to 1.0 mol/liter, approximately.

The above-mentioned organic solvent to be used as a solvent for a solid CVD-material is that having a boiling point usually ranging from 40° C. to 140° C. Examples of the solvent include such ethers as propyl ether, methylbutyl ether, ethylpropyl ether, ethylbutyl ether, trimethylene oxide, tetrahydrofuran and tetrahydropyran; alcohols such as methyl alcohol, ethyl alcohol, propyl alcohol and butyl alcohol; ketones such as acetone, ethyl methyl ketone, isopropyl methyl ketone and isobutyl methyl ketone; amines such as propylamine, butylamine, diethylamine, dipropylamine and triethylamine; esters such as ethyl acetate, propyl acetate and butyl acetate; and hydrocarbons such as hexane, heptane and octane.

In what follows, detailed description will be given of the vaporizer according to the present invention with reference to FIG. 1 to FIG. 3, which however shall never limit the present invention thereto.

FIGS. 1(A) to (C) each is a vertical cross-sectional view showing one example of vaporizer according to the present invention; FIG. 2 is a vertical cross-sectional view showing one example of a CVD material feed portion for a vaporizer according to the present invention; and FIGS. 3(A) to (D) each is a vertical cross-sectional view showing one example of a CVD material feed portion for a vaporizer according to the present invention other than that in FIG. 2.

Figure 1:
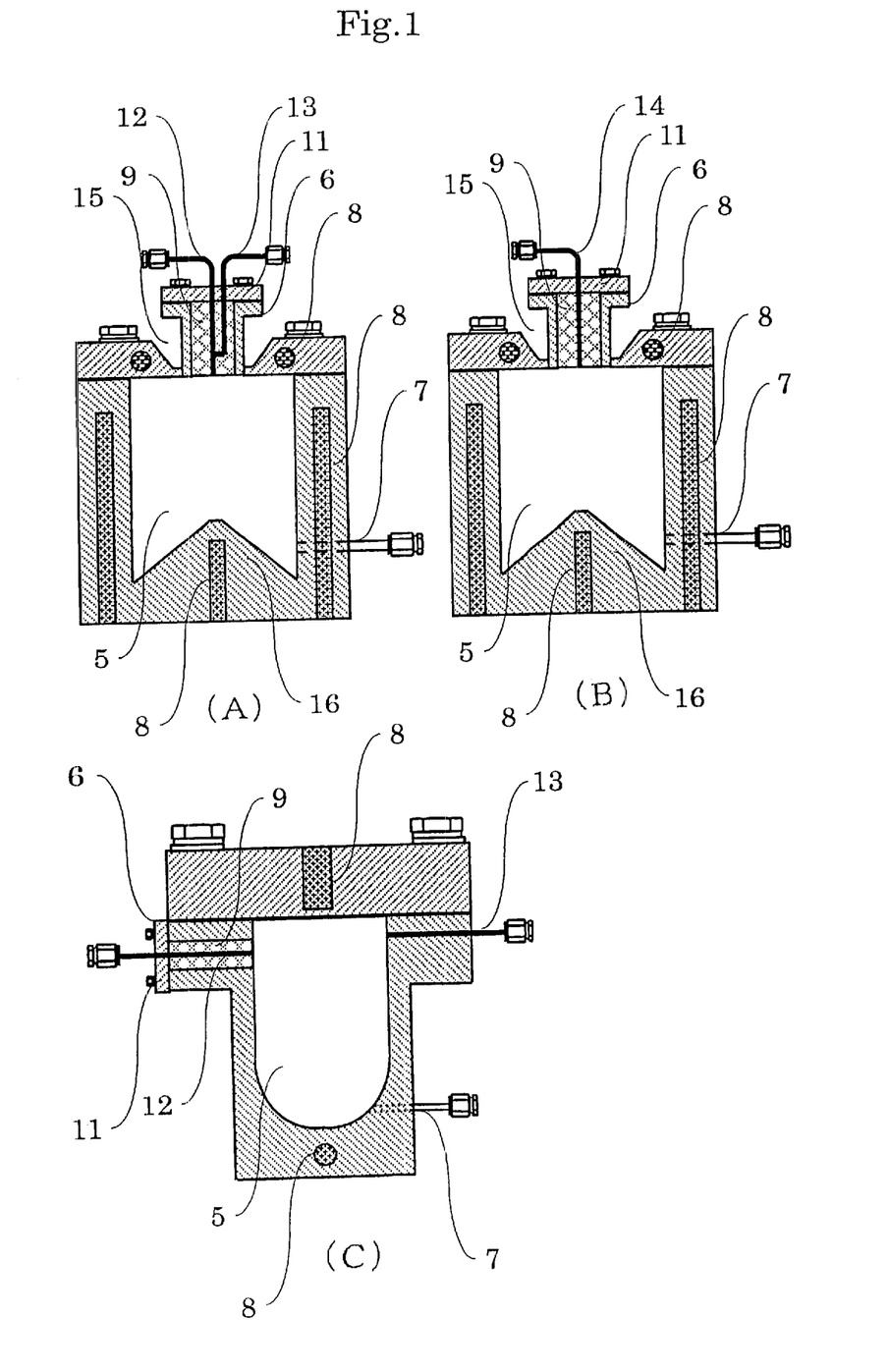
FIGS. 1(A) to (C) each is a vertical cross-sectional view showing one example of a vaporizer according to the present invention.

As illustrated in FIG. 1, the vaporizer according to the present invention comprises a vaporization chamber 5 for a CVD material, a CVD material feed portion 6 for supplying the vaporization chamber with the CVD material, a vaporized gas exhaust port 7 and a heating means 8 (heater or the like) for heating the vaporization chamber, and is characterized in that at least a portion of the CVD material feed portion in contact with the CVD material (peripheral portion of CVD material passageway 12 or passageway 14) is constituted of a corrosion resistant synthetic resin such as fluororesin and polyimide resin. In addition, illustrated in FIG. 2, the vaporizer according to the present invention is preferably characterized in that the inside of the CVD material feed portion 9 and the surface on the side of the vaporization chamber of the CVD material feed portion 10 are constituted of a corrosion resistant synthetic resin such as fluororesin and polyimide resin, and that the CVD material feed portion in contact with the outside of the vaporizer 11 is constituted of a metal. In FIG. 1 and FIG. 2, the symbol 13 denotes a carrier gas passageway, the symbol 14 denotes a passageway of CVD material and carrier gas, the symbol 15 denotes a space, the symbol 16 denotes a protrusion having heating means, and the symbol 17 denotes a tube made of stainless steel.

Figure 2:
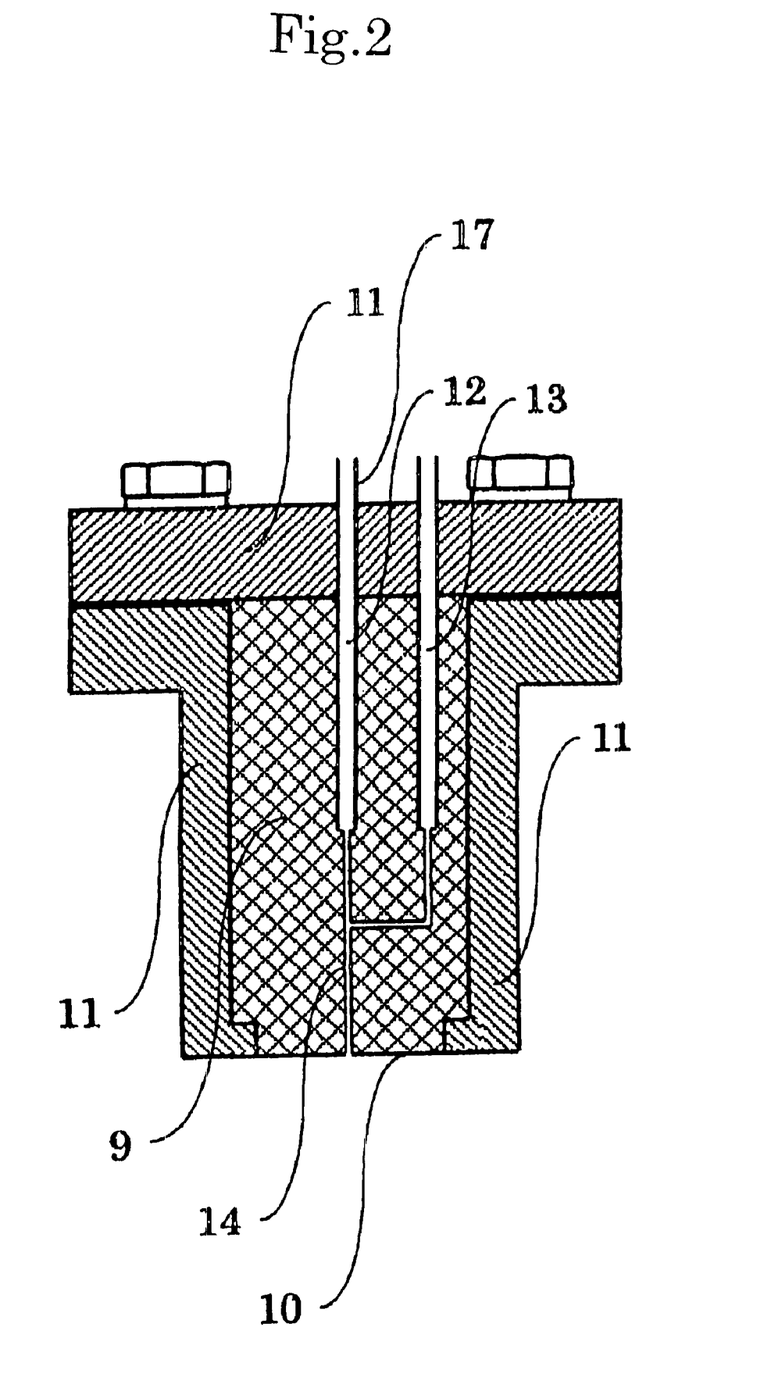
FIG. 2 is a vertical cross-sectional view showing one example of a CVD material feed portion for a vaporizer according to the present invention;.
Figure 3:
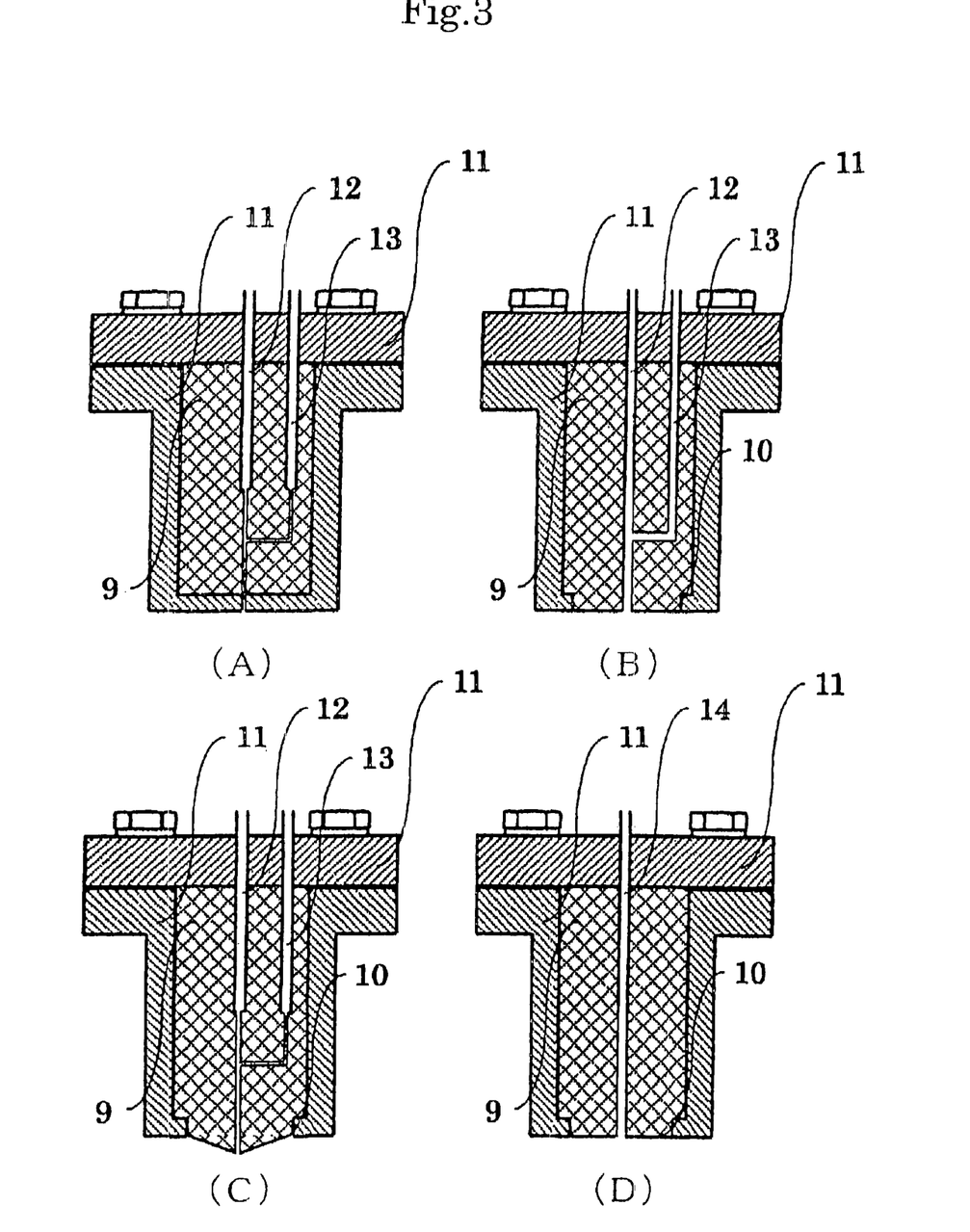
FIGS. 3(A) to (D) each is a vertical cross-sectional view showing one example of a CVD material feed portion according to the present invention other than that in FIG. 2.

The portion constituted of a corrosion resistant synthetic resin is formed usually in the inside of a CVD material feed portion without specific limitation in shape, and is preferably in the form of column or similar thereto as illustrated in FIG. 2. The CVD material is supplied to the vaporization chamber through a passageway 12 constituted of stainless steel tube 17 and corrosion resistant synthetic resin. In the case where the stainless steel tube is installed by inserting it into the inside of the portion constituted of the corrosion resistant synthetic resin, the connection portion therebetween needs to be free from leakage, and further in the case of using a joint, it is preferable to seal the joint so as not to cause rotational torque.

The portion constituted of a corrosion resistant synthetic resin may be placed only on the peripheral portion of the CVD material passageway. In the case of using a solid CVD material dissolved in an organic solvent, the above-mentioned portion has preferably an increased thickness in order to prevent the solvent from being vaporized in the passageway by sudden heating with a heating means such as a heater. However, when the portion constituted of a metal is made unreasonably thin, airtightness becomes difficult to maintain, and therefore the metal thickness is usually made to be at least 1.0 mm. By virtue of the vaporizer having such constitution according to the present invention, the wall surface of the passageway constituted of a corrosion resistant synthetic resin is less liable to the adhesion of the solid CVD-material even if the solvent alone is vaporized to form deposits of the solid CVD material.

Further, stainless steel such as SUS316 and SUS316L, which is usually used as a material of construction for a CVD material feed portion of conventional vaporizers, features in high heat transmission and liability to adhesion of solid CVD materials and thus brings about a fear that the CVD material is rapidly heated by the heating means to vaporize an organic solvent alone, whereby the solid CVD materials are deposited and stuck to a CVD material feed port. As opposed to the foregoing, the vaporizer according to the present invention minimizes such a fear, since as described hereinbefore, the CVD material feed portion in contact with the CVD material is constituted of the corrosion resistant synthetic resin featuring in least liability to adhesion thereof as well as heat insulating property.

For the purpose of preventing adhesion of a solid CVD material to the CVD material feed portion in the case of using such a material, it is preferable to constitute the vaporizer according to the present invention so that the CVD material is incorporated with a carrier gas to increase the linear velocity of the mixture, and then the resultant mixture is supplied to the vaporization chamber. Further for the purpose of preventing adhesion of a solid CVD material to the CVD material feed port in the aforesaid constitution, it is preferable to narrow the CVD material passageway in the CVD material feed portion at the vicinity of the feed port for the vaporization chamber so as to increase the linear velocity thereof. For the same purpose, it is preferable to constitute the CVD material feed portion so that the outer shape thereof on the side of the vaporization chamber is made to be convex towards the chamber, specifically conical, truncatedly conical, hemispherical or similar as illustrated in FIG. 3(C).

The vaporizer according to the present invention is equipped with a heating means capable of setting a desirable temperature according to the operational conditions including the type of liquid CVD material, feed amount, concentration of vaporized gas and the like. The configuration of installing the heating means is not specifically limited, provided that it is capable of heating and thermally insulating the vaporization chamber in high precision. For instance, a heater as a heating means is incorporated in a constitutional portion on the side face of the vaporizer. However, for the purpose of further enhancing the effect on preventing rapid heating of CVD material in the CVD material feed portion in the case of using a solid CVD-material dissolved in an organic solvent, it is preferable to install a spacial portion in the outer wall of a vaporization chamber around the side face of the CVD material feed portion so as to restrict the heat transmission to the feed portion. The heating temperature for the vaporization chamber, although varies depending upon the operational conditions including the type of liquid CVD material, feed amount, concentration of vaporized gas and the like, is usually set on 40 to 250° C.

In the vaporizer according to the present invention, the corrosion resistant synthetic resin to be used as a material of construction for the CVD material feed portion in contact with the CVD material, inside thereof or the surface on the side of the vaporization chamber, is not specifically limited, provided that it is imparted with heat resistance not lower than the boiling point of the solvent to be used and corrosion resistance against the CVD material and the solvent. Examples of such resin include phenolic resin, urea resin, melamine resin, polyester resin, epoxy resin, polyurethane resin, polyamide resin, fluororesin and polyimide based resin. In the case where the resin other than fluororesin and polyimide based resin is used, there is a fear that the CVD material or the solvent, depending on the type thereof, adversely acts on the resin other than the above two, thereby making it preferable to cover the surfaces in contact with the CVD material and the solvent with fluororesin or polyimide based resin.

Any type of fluororesin is usable, provided that it is imparted with heat resistance, corrosion resistance, heat insulating property and characteristic of less liability to the adhesion of the CVD material. The fluororesin is exemplified by polytetrafluoroethylene (PTEF), polytrifluoroethylene(PTrEF), polyvinylidenefluoride (PVdF) and tetrafluoroethylene/perfluoroalkylvinyl ether copolymer(PFA).

Any type of polyimide based resin is usable for the same portion as the foregoing, provided that it bears the structure of (—N(CO)$_2$—) in molecules of polyimide resin, polyimideamide resin or the like, and it is imparted with heat resistance, corrosion resistance, heat insulating property and characteristic of less liability to the adhesion of the CVD material.

Examples of metals to be used as a material of construction for the CVD material feed portion in contact with the outside of the vaporizer include carbon steel, manganese steel, chromium steel, molybdenum steel, stainless steel and nickel steel.

The form of the vaporization chamber in the vaporizer according to the present invention is not specifically limited, but is usually cylindrical or similar to cylindrical form. The material of construction usable for the vaporization chamber is not specifically limited, but is exemplified by carbon steel, manganese steel, chromium steel, molybdenum steel, stainless steel and nickel steel. Of these are preferably usable stainless steel such as SUS316 and. SUS316L or high nickel steel such as inconel and hastelloy.

The vaporizer according to the present invention can be used in combination with any of other means for enhancing vaporization efficiency. For instance, it is possible that the CVD material feed portion in contact with the CVD material is made of a corrosion resistant synthetic resin, the form of the vaporization chamber is made to be a sphere, ellipsoid, barrel, cylinder, cone, truncated cone, hemisphere or a form similar to any of the foregoing, and the direction of a carrier gas feed port is set so as to form a swirling flow in the vaporization chamber. It is made possible thereby to heat a solution of a solid CVD-material in an organic solvent by heating through the inside wall surface of the vaporization chamber without causing deposition of the solid CVD-material at the CVD material feed port, to contactingly heat the solution by entangling it in the heated carrier gas which is supplied through the carrier gas feed port of the chamber and which swirls along the inside wall surface thereof, and thus to efficiently vaporize the solid CVD material at a desirable concentration and flow rate.

As the combination with any of other means for enhancing vaporization efficiency, there is exemplified by a vaporizer in which the CVD material feed portion in contact with the CVD material is constituted of a corrosion resistant synthetic resin and at the same time, in the central portion of the vaporization chamber a protrusion having a heating means is fixedly installed on the lower part thereof. It is made possible thereby to heat a solution of a solid CVD material in an organic solvent by heating through the inside wall surface of the vaporization chamber and with protrusion in the central porion of the vaporization chamber without causing deposition of the solid CVD material at the CVD material feed port, and thus to efficiently vaporize the solid CVD material at a desirable concentration and flow rate.

In the following, detailed description will be given of the apparatus for vaporizing and supplying according to the present invention with reference to FIG. 4 to FIG. 7.

Figure 4:
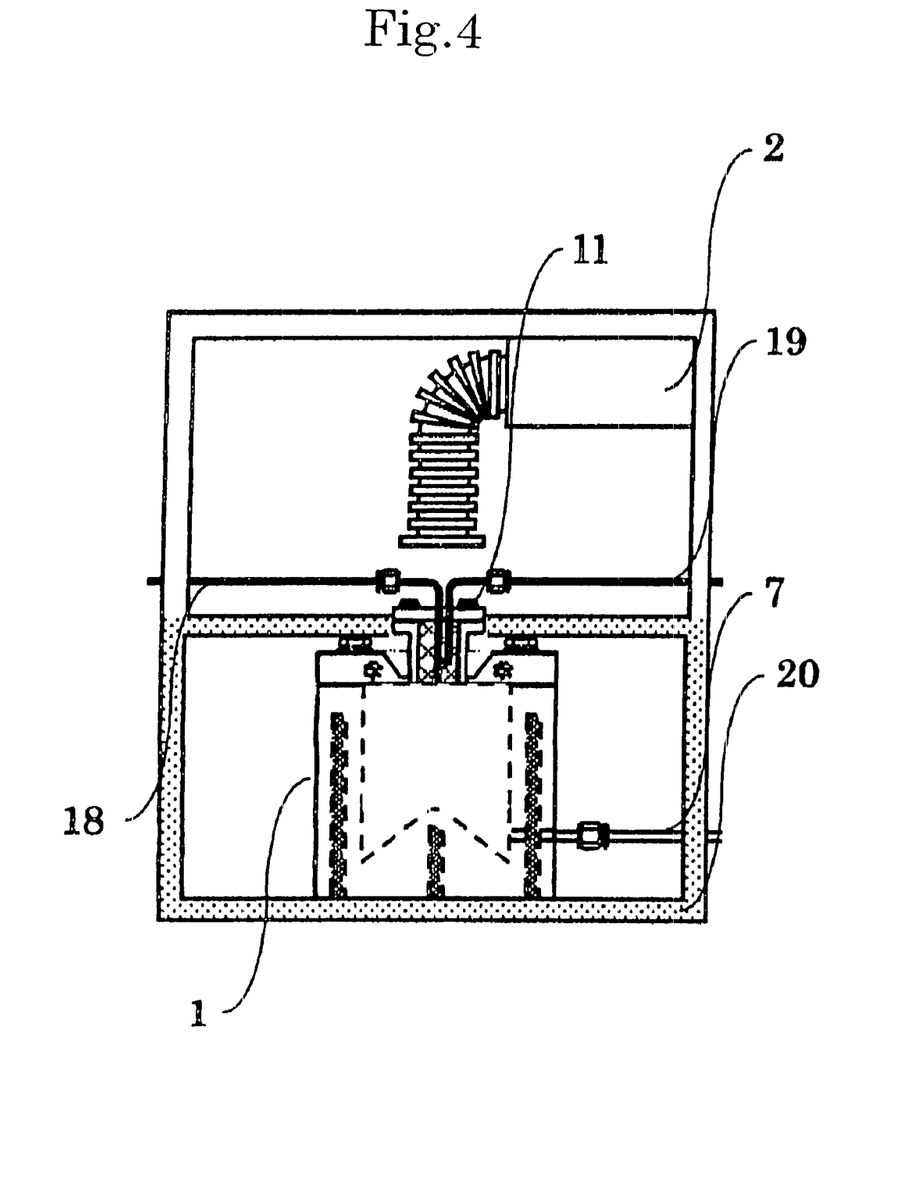
FIG. 4 is a constitutional view showing one example of the constitution of an apparatus for vaporizing and supplying according to the present invention.
Figure 5:
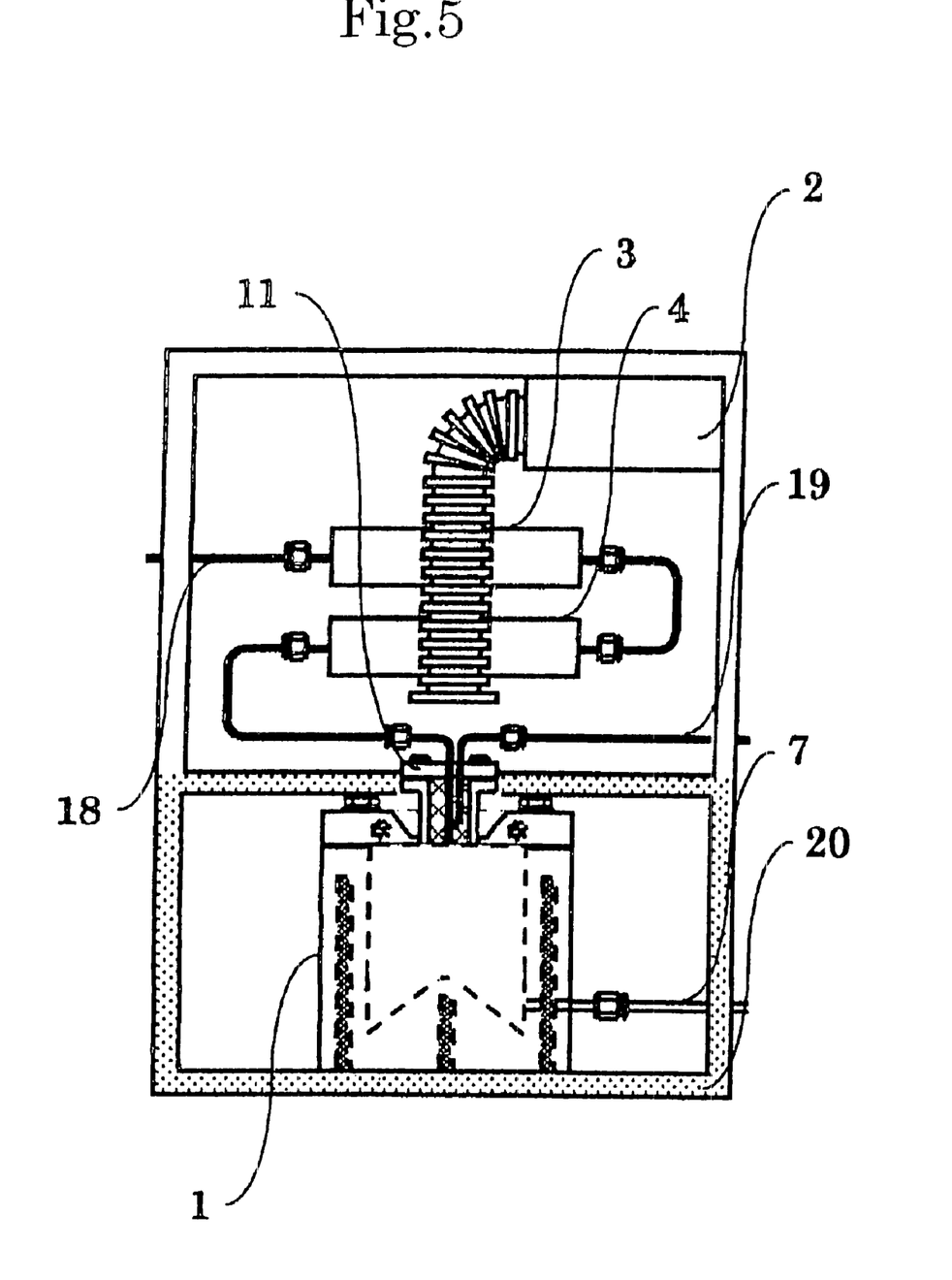
FIG. 5 is a constitutional view showing one example of the constitution of an apparatus for vaporizing and supplying according to the present invention other than that in FIG. 4.

FIG. 4 and FIG. 5 are each a constitutional view showing one example of the constitution of an apparatus for vaporizing and supplying according to the present invention;

As illustrated in FIG. 4, the apparatus for vaporizing and supplying according to the present invention, which is an apparatus comprising a vaporizer 1 and a cooler 2, may further comprise as illustrated in FIG. 5, a degassing unit 3 for the CVD material and/or a mass flow controller 4 in addition to the the vaporizer and cooler. As illustrated in FIG. 4 and 5 in the present invention, the constitution is such that at least part of the CVD material feed portion of the vaporizer-which portion is in contact with the outside of the vaporizer 11 (metal-made portion) can be cooled with a cooler.

The cooler 2 in these figures is a sirocco fan, and the constitution is such that the metal-made portion of the CVD material feed portion is cooled with the fan. However, a cooling mechanism is not limited thereto, but use may be made of, for instance, a cooler utilizing cooling water. In the apparatus for vaporizing and supplying according to the present invention, it is preferable to thermally insulate the vaporizer with a heat insulating material. In FIGS. 4 and 5, the symbol 18 denotes a CVD material feed pipe, the symbol 19 denotes a carrier gas feed pipe, and the symbol 20 denotes a heat insulating material.

Figure 6:
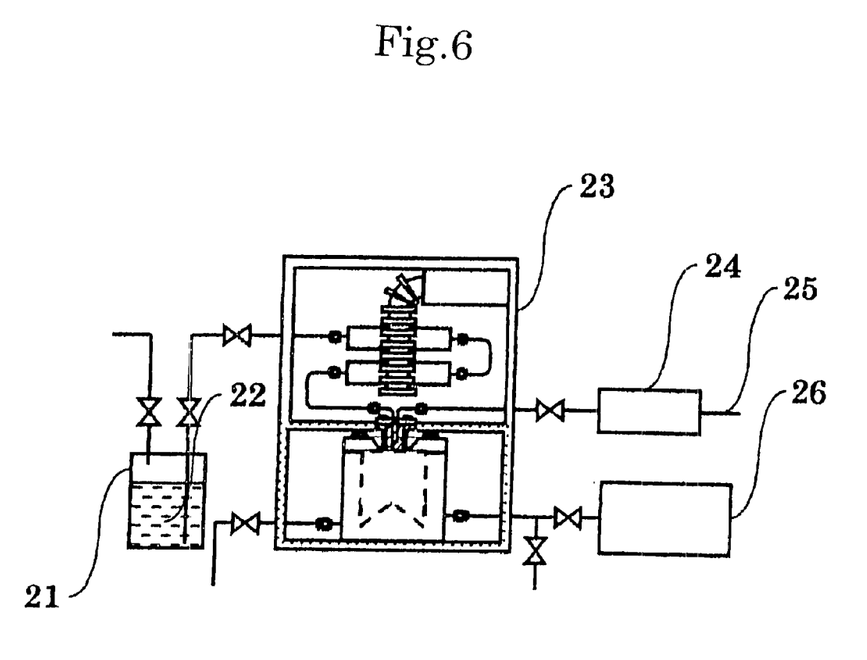
FIG. 6 is a constitutional view showing one example of the constitution of a system which supplies a vaporized gas to a chemical vapor deposition (CVD) apparatus by using the vaporizer and the apparatus for vaporizing and supplying according to the present invention.
Figure 7:
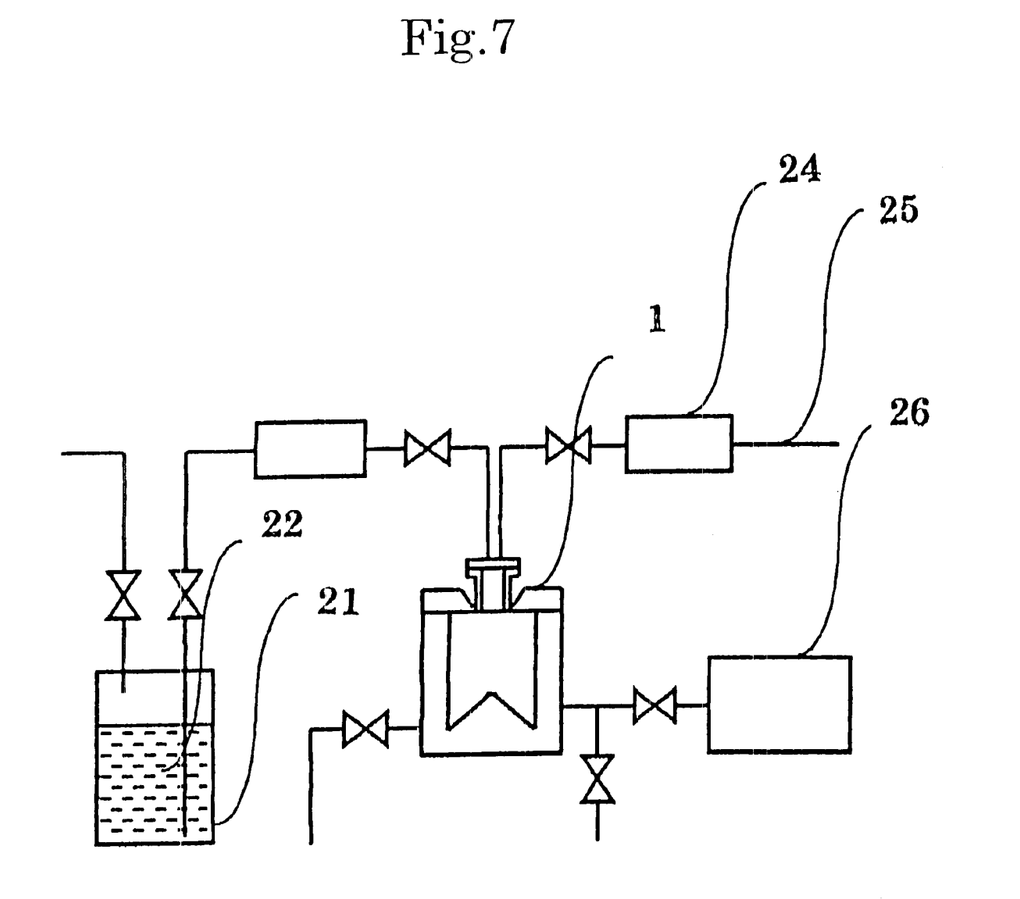
FIG. 7 is a constitutional view showing one example of the constitution of a system for vaporizing and supplying to which is applied the vaporizer according to the present invention.

FIG. 6 is a constitutional view showing one example of the constitution of a system which supplies a vaporized gas to a chemical vapor deposition (CVD) apparatus by using the vaporizer and the apparatus for vaporizing and supplying according to the present invention; and FIG. 7 is a constitutional view showing one example of the constitution of a system for vaporizing and supplying to which are applied the vaporizer and a method for vaporizing and supplying according to the present invention.

The present invention is intended to efficiently vaporize and supply a liquid CVD-material at a desirable concentration and flow rate. For the sake of this intent, such trouble shall never take place as the CVD material being deteriorated prior to the supply to the vaporizer or non-uniform concentration or flow rate of the material. A vessel for a liquid CVD material, which is intended to supply the liquid CVD material, is not specifically limited in regard to the size or form, provided that it is capable of retaining the material without affecting the quality thereof. In the case of maintaining the vessel under pressure and pressurizingly supplying to a liquid flow control portion, the vessel for a liquid CVD material is preferably of such construction as withstanding a pressure of 5 $kgf/cm^2$, approximately.

The liquid flow control portion is intended to quantitatively supply the vaporizer with a liquid material at a high precision, and the use of, for instance, a liquid mass flow controller enables to supply at a high precision. It is also possible to constitute the same of a variable flow pump and a control valve, or a pump and a flow controller. In the case where a pump is used, use is usually made of a double throw or multi-throw anticorrosive bellows pump or the like. It is also possible to install a non-return valve on the secondary side so as to enable flow control even in the case where a CVD apparatus is operated under reduced pressure.

In addition, in order to accurately weigh a CVD material by means of the mass flow controller, it is possible to install a degassing unit on the preceding stage of a mass flow controller which unit is capable of removing inert gases dissolved in the CVD material. The degassing unit is exemplified by such a unit that removes gases by passing a liquid material in which a first inert gas is dissolved in the inside of a gas-permeable tube made of a synthetic resin, passing a second inert gas having permeability to the synthetic resin tube lower than that of the first inert gas along the outside surface of the tube, suppressing the second inert gas from permeating to the inside of the tube, and thus allowing the first inert gas to permeate to the outside of the tube {refer to Japanese Patent Application Laid-Open No. 348156/1999 (Heisei-11)}.

In FIGS. 6 and 7, the symbol 21 denotes a vessel for a liquid CVD material, the symbol 22 denotes a liquid CVD material, the symbol 23 denotes an apparatus for vaporizing and supplying, the symbol 24 denotes a gas flow controller, the symbol 25 denotes a carrier gas feed line, and the symbol 26 denotes a chemical vapor deposition (CVD) apparatus.

In the case of vaporizing a CVD material wherein a solid CVD-material is dissolved in an organic solvent, the vaporization chamber is heated, and at least one metal-made portion 11 of the CVD material feed portion in the vaporizer is cooled with the cooler. The temperature of the above-mentioned metal-made portion at this time varies depending upon the organic solvent to be used, and thus can not be unequivocally defined, but is usually not higher than 80° C., preferably not higher than 50° C. A method for vaporizing and supplying by using the apparatus for vaporizing and supplying according to the present invention enables to prevent rapid heating of the CVD material or heating of the organic solvent in the CVD material feed portion by virtue of not only using the synthetic resin superior to any metal in heat insulating property as inside construction material for the CVD material feed portion, but also cooling the CVD material feed portion at the time of heating the vaporization chamber.

In summarizing the working effects and advantages of the present invention, the use of the vaporizer according to the present invention has enabled, even in the case of using a solid CVD-material as a CVD material, the material to be efficiently vaporized and supplied at desirable concentration and flow rate without generating any deposit of the material accompanied with adhesion thereof.

In addition, the apparatus for vaporizing and supplying according to the present invention is characterized in that the constructional material for the inside and surfaces of the vaporization chamber of the CVD material feed portion in the vaporizer is a synthetic resin which is imparted with heat resistance, corrosion resistance and besides heat insulating property, and which is less liable to the adhesion of a CVD material, and also in that the foregoing apparatus is equipped with a mechanism for cooling the CVD material feed portion at the time of heating the vaporization chamber, whereby even in the case of using a solid CVD-material dissolved in an organic solvent, the apparatus prevents the organic solvent alone from vaporizing by being subjected to heat transmission from the heating means in the vaporizer, and the apparatus is least liable to the adhesion of deposits even if the solid CVD-material is deposited. Consequently, it is enabled thereby to efficiently vaporize and supply the CVD material at desirable concentration and flow rate without causing such deterioration of the quality or purity of an insulated thin film that is due to the deposition and adhesion of the solid CVD material at the CVD material feed port.

In what follows, the present invention will be described in more detail with reference to comparative examples and working examples, which however shall never limit the invention thereto.

EXAMPLE 1

There was prepared a CVD material feed portion as illustrated in FIG. 2 in which the inside thereof and the surface on the side of a vaporization chamber were constituted of a fluororesin (PFA), and the portion in contact with the outside of the vaporizer was constituted of stainless steel (SUS316). The PFA made portion was a column having an outside diameter of 16 mm and a height of 34.2 mm. The stainless steel outside the column had a thickness of 2.0 mm. The CVD material feed portion had such constitution that as the piping for a CVD material and carrier gas, two stainless steel tubes each having an inside diameter of 1.5 mm and a joint (manufactured by Atsugi Valve Fitting Co., Ltd. under the trade name "SWAGELOK") at an end thereof are inserted into the PFA made portion and fitted thereto, and a CVD material and carrier gas are mixed with each other inside the PFA made portion and thereafter supplied to a vaporization chamber. The PFA made passageway for the CVD material and carrier gas had an inside diameter of 0.3 mm.

There was also prepared, in addition to the foregoing CVD material feed portion, as illustrated in FIG. 1, a vaporizer which was made of SUS316 and incorporated with a vaporized gas exhaust port, a heating means for the vaporization chamber and a protrusion housing a heater. The vaporization chamber was in the form of a column having an inside diameter of 65 mm and a height of 92.5 mm and a protrusion height at the bottom of 27.5 mm. The vaporized gas exhaust port was placed at a height of 15 mm from the bottom of the vaporizer. Subsequently, a vaporizing and supplying system as illustrated in FIG. 7 was fabricated by connecting a liquid mass flow controller, a carrier gas feed line and the like.

Subsequently, a test for vaporizing and supplying was made in the following manner by the use of the foregoing equipment.

The vaporization chamber was set on 10 torr and 270° C., the CVD material feed portion of the vaporizer was charged with a liquid CVD-material having a concentration of 0.1 mol/liter in which $Sr(DPM)_2$ as a solid CVD-material was dissolved in THF as a solvent at a flow rate of 1.0 g/min and nitrogen gas at a flow rate of 0.3 liter/min, thereby mixing the material and the gas inside the PFA made portion, and then the liquid CVD material was vaporized in the chamber. After continuous test for vaporizing and supplying for one hour, investigation was made on the state of adhesion of the solid CVD-material in the passageway of the CVD material feed portion. As a result, no deposition of the CVD-material was recognized, thus enabling to confirm that the CVD material had efficiently been vaporized and supplied.

EXAMPLE 2

The procedure in Example 1 was repeated to prepare a vaporizer and carry out a continuous test for vaporizing and supplying for one hour except that the inside of a CVD material feed portion and the surface on the side of a vaporization chamber were constituted of a polyimide resin in place of the fluororesin. As a result, no deposition of the solid CVD material was recognized in the passageway of the CVD material feed portion, thereby enabling to confirm that the CVD material had efficiently been vaporized and supplied.

Comparative Example 1

The procedure in Example 1 was repeated to prepare a vaporizer and carry out a continuous test for vaporizing and supplying except that the material of construction for the CVD material feed portion was altered to stainless steel (SUS316). As a result, after 15 minutes from the start of the test, the passageway of the CVD material feed portion was clogged by the deposit of $Sr(DPM)_2$, whereby the test was discontinued.

EXAMPLE 3

Preparation of an Apparatus for Vaporizing and Supplying

There was prepared a CVD material feed portion as illustrated in FIG. 2 in which the inside thereof and the surface on the side of a vaporization chamber were constituted of a fluororesin (PFA), and the portion in contact with the outside of the vaporizer was constituted of stainless steel(SUS316). The PFA made portion was a column having an outside diameter of 16 mm and a height of 34.2 mm. The stainless steel outside the column had a thickness of 2.0 mm. The CVD material feed portion had such constitution that as the piping for a CVD material and carrier gas, two stainless steel tubes each having an inside diameter of 1.5 mm and a joint (manufactured by Atsugi Valve Fitting Co., Ltd. under the trade name "SWAGELOK") at an end thereof were inserted into the PFA made portion and fitted thereto, and a CVD material and carrier gas are mixed with each other inside the PFA made portion and thereafter supplied to a vaporization chamber. The PFA made passageway for the CVD material and carrier gas had an inside diameter of 0.3 mm.

There was also prepared, in addition to the foregoing CVD material feed portion, as illustrated in FIG. 1, a vaporizer which was made of SUS316 and incorporated with a vaporized gas exhaust port, a heating means for the vaporization chamber and a protrusion housing a heater. The vaporization chamber was in the form of a column having an inside diameter of 65 mm and a height of 92.5 mm and a protrusion height at the bottom of 27.5 mm. The vaporized gas exhaust port was placed at a height of 15 mm from the bottom of the vaporizer. Further, the vaporizer had such constitution that non-vaporized CVD material could be taken out through the bottom of the vaporizer. Subsequently, an apparatus for vaporizing and supplying as illustrated in FIG. 5 was fabricated by connecting a degassing unit, a liquid mass flow controller, a CVD material feed line, a carrier gas feed line and the like to the vaporizer, and by installing a sirocco fan so as to enable the SUS 316 made portion of the CVD material feed portion to be cooled therewith. In addition, the apparatus for vaporizing and supplying was connected to the CVD material vessel and carrier gas feed line, and the vaporized gas exhaust port of the vaporizer was connected to a liquid nitrogen cooling trap for capturing the CVD material in the vaporized gas.

Test for Vaporizing and Supplying

Subsequently, a test for vaporizing and supplying was made in the following manner by the use of the foregoing equipment.

The vaporization chamber was set on 10 torr and 270° C., and the SUS 316 made portion of the CVD material feed portion (top of the CVD material feed portion) was maintained at 45 to 50° C. with the sirocco fan. Then, the CVD material feed portion of the vaporizer was charged with a liquid CVD-material having a concentration of 0.1 mol/liter in which $Sr(DPM)_2$ as a solid CVD-material was dissolved in THF as a solvent at a flow rate of 1.0 g min and nitrogen gas at a flow rate of 0.3 liter min, thereby mixing the material and the gas inside the PFA made portion, and then the liquid CVD-material was vaporized in the chamber. The vaporized gas exhausted from the exhaust port of the vaporizer was sampled by cooling for 5 hours to complete the vaporizing and supplying.

$Sr(DPM)_2$ was collected from the liquid CVD-material that had been collected by cooling, accurately weighed with an electronic balance, and analyzed by FT-IR to examine the same. As a result, the vaporization efficiency was 99.7%. After the test for vaporizing and supplying, investigation was made on the state of adhesion of the solid CVD material in the passageway of the CVD material feed portion. As a result, no deposition of the solid CVD material was recognized, thus enabling to confirm that the CVD material had efficiently been vaporized and supplied.

EXAMPLE 4

The procedure in the preparation of an apparatus for vaporizing and supplying in Example 3 was repeated to prepare a vaporizer except that the inside of a CVD material feed portion of the vaporizer and the surface on the side of a vaporization chamber were constituted of a polyimide resin in place of the fluororesin. Then an apparatus for vaporizing and supplying was prepared by the use of the resultant vaporizer in the same manner as in Example 1.

Subsequently, continuous test for vaporizing and supplying was carried out for 5 hours in the same manner as in Example 3. As a result, the vaporization efficiency was 99.6% Further no deposition of the solid CVD-material was recognized in the passageway of the CVD material feed portion, thereby enabling to confirm that the CVD material had efficiently been vaporized and supplied.

EXAMPLE 5

The procedure in the preparation of an apparatus for vaporizing and supplying in Example 3 was repeated to prepare a vaporizer except that the inside of a CVD material feed portion of the vaporizer and the surface on the side of a vaporization chamber that were in contact with the CVD material, were constituted of a phenolic resin coated with Teflon in place of the fluororesin. Then an apparatus for vaporizing and supplying was prepared by the use of the resultant vaporizer in the same manner as in Example 1. Subsequently, continuous test for vaporizing and supplying was carried out for 5 hours in the same manner as in Example 3. As a result, the vaporization efficiency was 99.7%. Further no deposition of the solid CVD-material was recognized in the passageway of the CVD material feed portion, thereby enabling to confirm that the CVD material had efficiently been vaporized and supplied.

EXAMPLE 6

By the use of an apparatus for vaporizing and supplying same as in Example 3 and TTIP (tetraisopropoxytitanium) as a liquid CVD-material, a test for vaporizing and supplying was continuously carried out for 5 hours in the same manner as in Example 3 except that the vaporization chamber was set on 20 torr and 190° C., and the CVD material feed portion of the vaporizer was charged with TTIP at a flow rate of 2.0 g/min and nitrogen gas at a flow rate of 0.1 liter/min. As a result, the vaporization efficiency was 99.4%. Further no deposition of the CVD material was recognized in the passageway of the CVD material feed portion, thereby enabling to confirm that the CVD material had efficiently been vaporized and supplied.

EXAMPLE 7

There were prepared two apparatuses for vaporizing and supplying same as in Example 3. Each of the apparatuses was connected to a CVD material vessel and carrier gas feed line, and two vaporized gas exhaust ports of the vaporizers were each connected to a CVD apparatus to which was fixed a silicon substrate having a diameter of 6 inches. The inside of the two apparatuses for vaporizing and supplying, and the inside of the CVD apparatus were purged with nitrogen gas, and both the apparatuses for vaporizing and supplying and the vaporization chamber were set on 10 torr and 270° C., and the SUS 316 made portion of the CVD material feed portion (top of the CVD material feed portion) was maintained at 45 to 50° C. with the sirocco fan. Then, either apparatus for vaporizing and supplying was charged with a liquid CVD-material having a concentration of 0.1 mol/liter in which $Sr(DPM)_2$ as a solid CVD-material was dissolved in THF as a solvent at a flow rate of 1.0 g/min and nitrogen gas at a flow rate of 0.5 liter/min, and the other apparatus for vaporizing and supplying was charged with a liquid CVD-material having a concentration of 0.1 mol/liter in which $TiO(DPM)_2$ as a solid CVD-material was dissolved in THF as a solvent at a flow rate of 1.0 g/min and nitrogen gas at a flow rate of 0.5 liter/min. The liquid CVD-materials were vaporized and supplied the CVD apparatus, so that crystal of $SrTiO_3$ was grown on the silicon substrate. The crystal was analyzed by X-ray diffraction. As a result, it was enabled to confirm that uniform crystal had been obtained.

Comparative Example 2

In the preparation of the apparatus for vaporizing and supplying, the procedure in Example 3 was repeated to prepare a vaporizer except that the material of construction for the CVD material feed portion was altered to stainless steel (SUS316). Further, the procedure in Example 3 was repeated to prepare an apparatus for vaporizing and supplying except that use was made of the above-prepared vaporizer, and the use of the sirocco fan was omitted. Subsequently, a test for vaporizing and supplying was carried out in the same manner as in Example 3. As a result, after 20 minutes from the start of the test, the passageway of the CVD material feed portion was clogged by the deposit of $Sr(DPM)_2$, whereby the test was discontinued. The temperature of the SUS316 made portion in the CVD material feed portion was in the range of 120 to 150° C.

Comparative Example 3

By the use of the apparatus for vaporizing and supplying same as in Comparative Example 2, a test for vaporizing and supplying was conducted by using TTIP (tetraisopropoxytitanium) as a liquid CVD-material in the same manner as in Example 6. The vaporization chamber was set on 20 torr and 190° C., and the CVD material feed portion of the vaporizer was charged with TTIP at a flow rate of 2.0 g/min and nitrogen gas at a flow rate of 0.1 liter/min. As a result, after 250 minutes from the start of the test, the passageway of the CVD material feed portion was clogged by the deposit of TTIP, whereby the test was discontinued. The temperature of the SUS316 made portion in the CVD material feed portion was in the range of 90 to 110° C.

What is claimed is:

1. A vaporizer which comprises a vaporization chamber for a CVD material, a CVD material feed portion for supplying the vaporization chamber with the CVD material, a vaporized gas exhaust port and a heating means for heating the vaporization chamber, wherein at least a portion of the CVD material feed portion in contact with the CVD material is constituted of a material comprising a corrosion resistant synthetic resin, wherein the at least a portion of the CVD material feed portion is equipped with a passageway adapted for mixing the CVD material and a carrier gas with each other inside the CVD material feed portion, and thereafter the mixture is supplied to the vaporization chamber.

2. A vaporizer which comprises a vaporization chamber for a CVD material, a CVD material feed portion for supplying the vaporization chamber with the CVD material, a vaporized gas exhaust port and a heating means for heating the vaporization chamber, wherein the inside of the CVD material feed portion and the surface on the side of the vaporization chamber of the CVD material feed portion are constituted of a material comprising a corrosion resistant synthetic resin, and the CVD material feed portion in contact with the outside of the vaporizer is constituted of a metal, wherein the CVD material feed portion is equipped with a passageway adapted for mixing the CVD material and a carrier gas with each other inside the CVD material feed portion, and thereafter the mixture is supplied to the vaporization chamber.

3. The vaporizer according to claim 1 or claim 2, wherein the corrosion resistant synthetic resin is a fluororesin or a polyimide based resin.

4. The vaporizer according to claim 1 or claim 2, wherein the portion constituted of a corrosion resistant synthetic resin is in the form of column.

5. The vaporizer according to claim 1 or claim 2, wherein the CVD material passageway in the CVD material feed portion is narrowed in the vicinity of a feed port to the vaporization chamber.

6. The vaporizer according to claim 1 or claim 2, wherein the external form on the side of the vaporization chamber in the CVD material feed portion is in the form of a cone, truncated cone, or hemisphere.

7. The vaporizer according to claim 1 or claim 2, wherein a spacial portion is installed in the outside wall of the vaporization chamber around a side face of the CVD material feed portion.

8. The vaporizer according to claim 1 or claim 2, which further comprises a carrier gas feed port set up in such a direction that a carrier gas swirls along the inside of a wall surface in the vaporization chamber.

9. The vaporizer according to claim 1 or claim 2, wherein a protrusion comprising a heating means is fixedly installed on the bottom central portion of the vaporization chamber.

10. A method comprising vaporizing a CVD material in the vaporizer according to claim 1 or claim 2, wherein the CVD material is a CVD material in which a solid CVD-material is dissolved in an organic solvent.

11. The method according to claim 10, wherein the solid CVD-material is at least one species selected from the group consisting of bis(2,2,6,6-tetramethyl-3,5-heptanedionite) barium, bis(2,2,6,6-tetramethyl-3,5-heptanedionite) strontium, tetra(2,2,6,6-tetramethyl-3,5-heptanedionite) titanium, tetra(2,2,6,6-tetramethyl-3,5-heptanedionite) zirconium, bis(2,2,6,6-tetramethyl-3,5-heptanedionite)lead, bis(cyclopentadienyl)barium, bis(cyclopentadienyl) strontium, hexacarbonylmolybdenum, dimethylpenthoxygold, (ditertiallybuthoxybis)(2,2,6,6-tetramethyl-3,5-heptanedionite)titanium, (diisopropoxy)(2,2,6,6-tetramethyl-3,5-heptanedionite)titanium, tetrakis (isobutyllylpivaloylmethanato)zirconium and (isopropoxy) tris(2,2,6,6-tetramethyl-3,5-heptanedionite)zirconium.

12. The method according to claim 10, wherein the organic solvent is at least one species selected from the group consisting of ethers, alcohols, ketones, amines, esters and hydrocarbons each having a boiling point in the range of from 40° C. to 140° C.

13. An apparatus for vaporizing and supplying which comprises a cooler and a vaporizer that harbors a vaporization chamber for a CVD material, a CVD material feed portion for supplying the vaporization chamber with the CVD material, a vaporized gas exhaust port and a heating means for heating vaporized gas exhaust port and a heating means for heating the vaporization chamber, wherein the inside of the CVD material feed portion of the vaporizer and the surface on the side of the vaporization chamber of the CVD material feed portion are constituted of a material comprising a corrosion resistant synthetic resin; the feed portion in contact with the outside of the vaporizer is constituted of a material comprising a metal; and at least part of the metal-constituted portion of the CVD material feed portion which undergoes heat transfer from the heating means at the time of heating the vaporization chamber, is of such constitution that enables said part to be cooled with said cooler, wherein the CVD material feed portion is equipped with a passageway adapted for mixing the CVD material and a carrier gas with each other inside the CVD material feed portion, and thereafter the mixture is supplied to the vaporization chamber.

14. The apparatus for vaporizing and supplying according to claim 13, which comprises, in addition to the cooler and a vaporizer, at least one of a degassing unit and a mass flow controller each for the CVD material.

15. The apparatus for vaporizing and supplying according to claim 13, wherein the cooler is a sirocco fan.

16. The apparatus for vaporizing and supplying according to claim 14, wherein the portion constituted of a corrosion resistant synthetic resin in the CVD material feed portion is in the form of column.

* * * * *